United States Patent [19]

Deeg et al.

[11] 3,950,176

[45] Apr. 13, 1976

[54] SEMICONDUCTING GLASSES AND THE METHOD OF PREPARATION THEREOF

[75] Inventors: Emil W. Deeg, Woodstock, Conn.;
Robert E. Graf, Southbridge, Mass.;
Robert J. Landry, Poolesville, Md.

[73] Assignee: American Optical Corporation, Southbridge, Mass.

[22] Filed: Apr. 24, 1974

[21] Appl. No.: 463,628

[52] U.S. Cl............... 106/47 R; 252/518; 252/519; 252/521; 252/63.5
[51] Int. Cl.[2].................... C03C 3/16; C03C 3/30
[58] Field of Search......... 106/47 R, 47 Q; 252/518, 252/63.5, 519, 521

[56] References Cited
UNITED STATES PATENTS

| | | | |
|---|---|---|---|
| 3,063,198 | 11/1962 | Babcock | 106/47 R |
| 3,518,209 | 6/1970 | Provance | 106/47 R |
| 3,520,831 | 7/1970 | Trap | 106/47 R |
| 3,650,778 | 3/1972 | Dumesmil et al. | 106/47 R |

*Primary Examiner*—Winston A. Douglas
*Assistant Examiner*—Mark Bell
*Attorney, Agent, or Firm*—H. R. Berkenstock, Jr.; William C. Nealon

[57] ABSTRACT

Chemically stable, semiconducting glasses having a resistivity of from about $2 \times 10^7$ to about $6 \times 10^8$ ohm·cm contain 25 to 35 weight percent of vanadium pentoxide, 10 to 20 weight percent phosphorous pentoxide, and from 35 to 45 weight percent of molybdenum trioxide. These semiconducting glasses are melted readily, are castable into desired shapes, and offer good resistance to devitrification.

14 Claims, 7 Drawing Figures

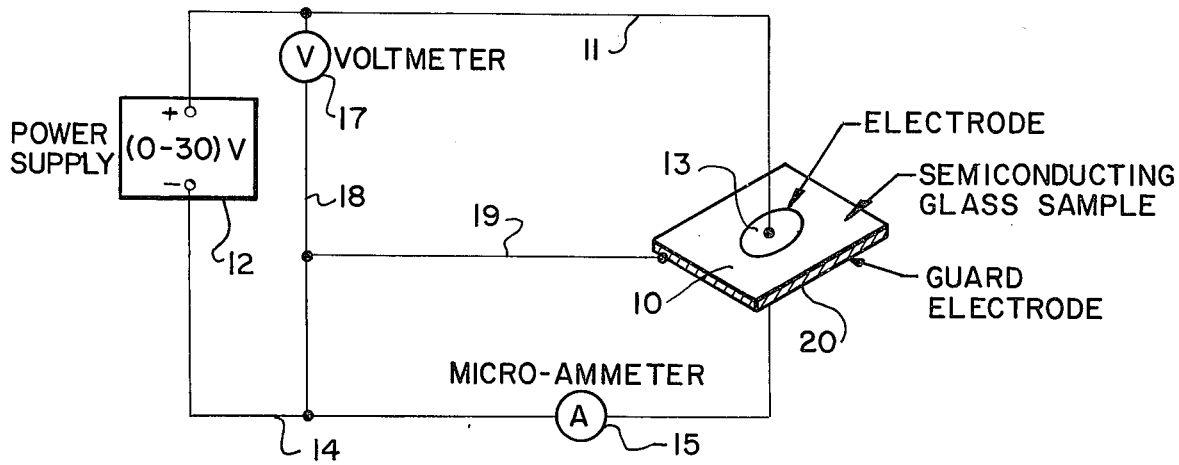
Fig_1
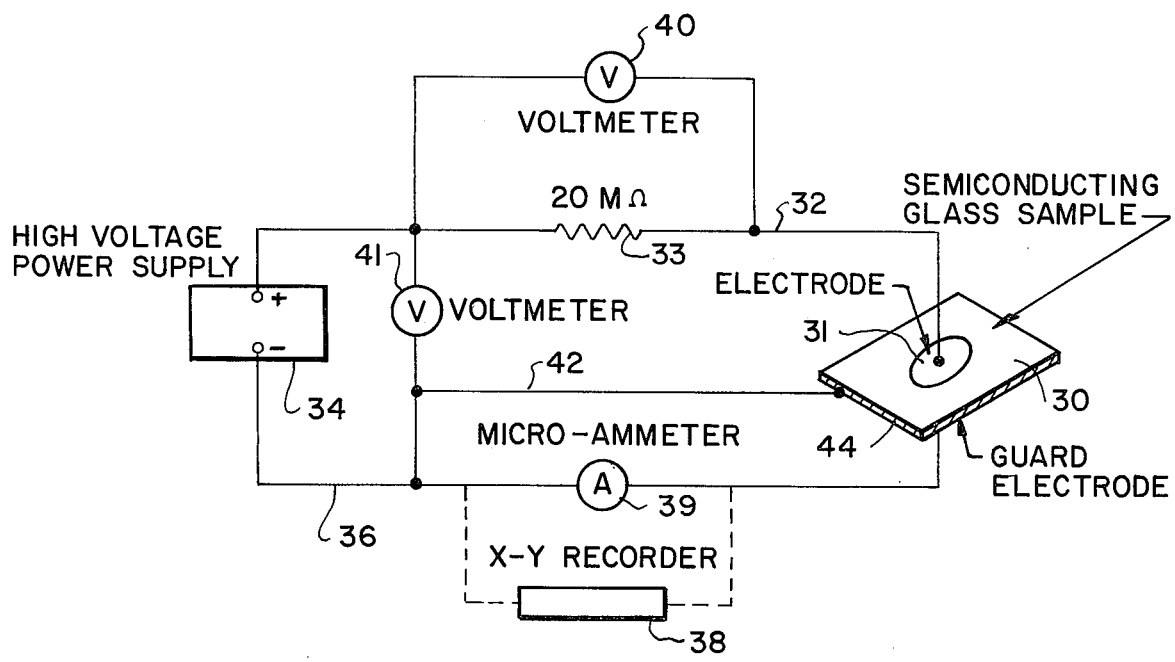
Fig_2

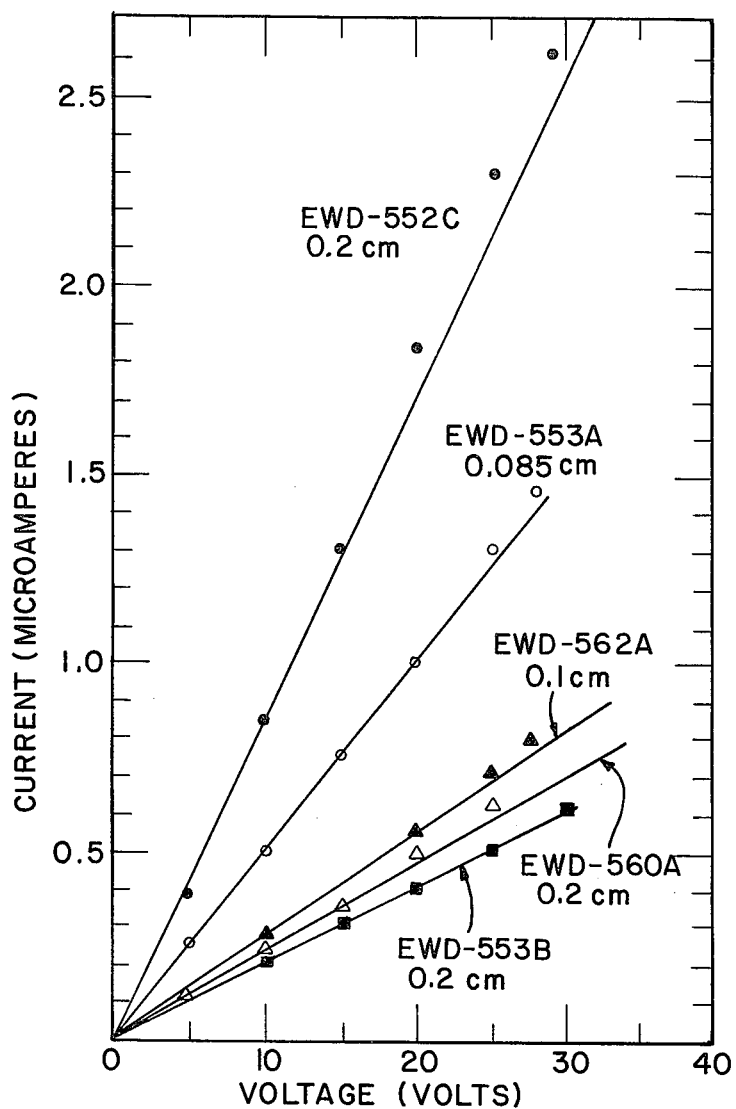
Fig_3
CURRENT VERSUS VOLTAGE PLOTS FOR VANADIUM-PHOSPHATE SEMICONDUCTING GLASSES AT LOW VOLTAGES. THICKNESS SHOWN IN CENTIMETERS.
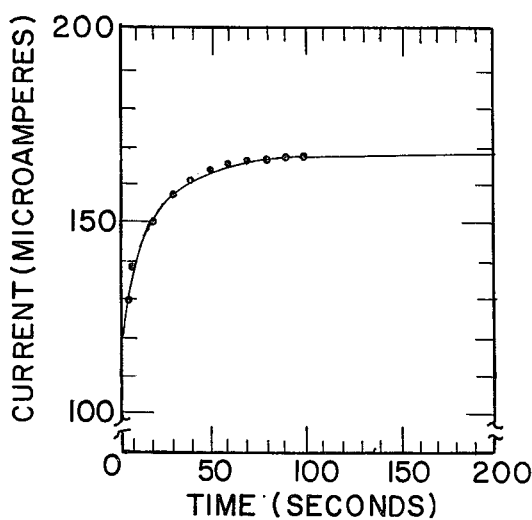
Fig_4
CURRENT VERSUS TIME PLOT OBSERVED FOR EWD-553A WITH 4.1 kV FROM THE POWER SUPPLY.

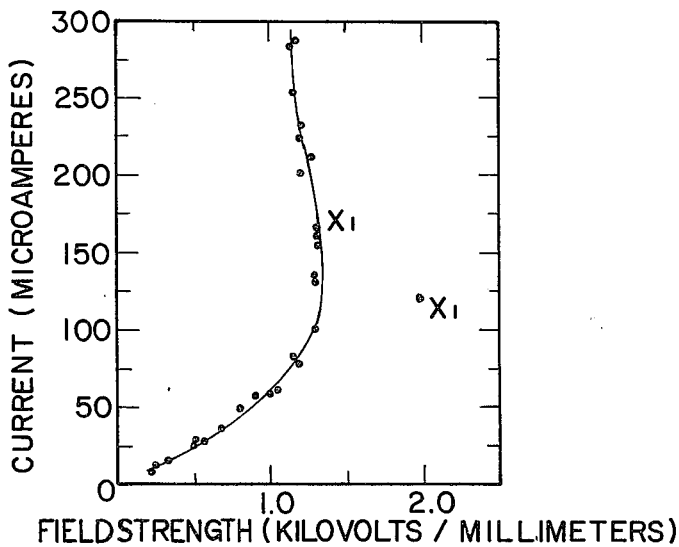
PLOT OF THE EQUILIBRIUM CURRENT VERSUS THE EQUILIBRIUM FIELD-STRENGTH ESTABLISHED ACROSS THE 0.085 cm THICK SAMPLE OF EWD-553A AT HIGH ELECTRIC FIELD STRENGTHS.
Fig_5
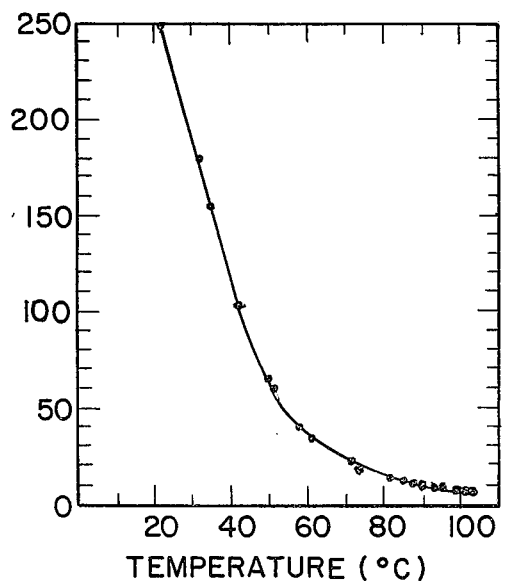
PLOT OF RESISTIVITY VERSUS TEMPERATURE IN AIR AT 20 V DC FOR 0.085cm THICK SAMPLE OF EWD-553A
Fig_6
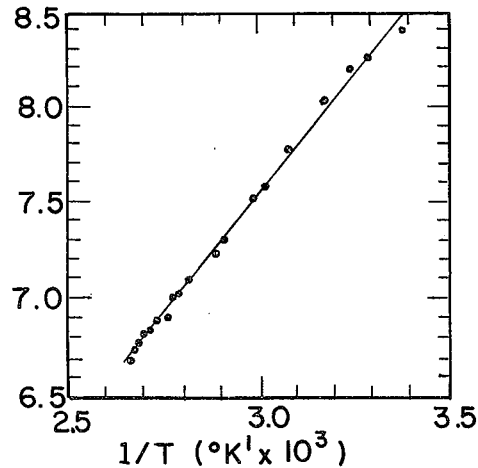
PLOT OF $LOG_{10}$ RESISTIVITY VERSUS $1/T$, WHERE T IS THE TEMPERATURE IN DEGREES KELVIN FOR 0.085 cm THICK SAMPLE OF EWD-553A.
Fig_7

SEMICONDUCTING GLASSES AND THE METHOD OF PREPARATION THEREOF

BACKGROUND OF THE INVENTION

This invention relates to novel semiconducting glasses and the method for their preparation.

Semiconducting elements have been found to have many and varied uses in a wide variety of arts. Included among these uses are the formation of resistive elements for electronic circuits, voltage stabilizers for use at high voltages, sensors for temperature measurement by means of electrical conductivity, and leakage resistors for electron microscopes.

For the use as leakage resistors, the resistivity of the glass should be in the range of about $2 \times 10^7$ to about $6 \times 10^8$ ohm·cm. In addition, the glasses should be chemically and physically stable and should be melted easily in reasonably large batches in standard laboratory equipment.

Prior art semiconductive glasses having similar electrical properties have been found to be unstable chemically. In particular, these prior art glasses are subject to devitrification. Conversely, other glasses which are sufficiently stable chemically fail to achieve the required electrical properties.

SUMMARY OF THE INVENTION

It is, therefore, among the objects and advantages of the invention, to provide novel semiconducting glasses, and the method for the fabrication thereof.

Another object of the invention is to provide such novel semiconducting glasses of a vanadium-molybdenum-phosphate type.

Yet another object of the invention is to provide such novel semiconducting glasses which are chemically and physically stable and have a resistivity of from about $2 \times 10^7$ to about $6 \times 10^8$ ohm·cm.

Additional and further objects, advantages and features of the invention will be apparent by reference to the following description taken together with the accompanying drawing.

DESCRIPTION OF THE DRAWING

FIG. 1 is a schematic diagram of an electrical circuit useful for measuring the conductivity of semi-conducting glasses at low electric field strengths;

FIG. 2 is a schematic diagram of an electric circuit useful for measuring the conductivity of semi-conducting glasses at high electric field strengths;

FIG. 3 is a graph showing current versus voltage, at low voltages, for a number of semiconducting glasses according to the present invention;

FIG. 4 is a graph of current versus time for one semiconducting glass according to the present invention;

FIG. 5 is a graph of the equilibrium current plotted against the equilibrium voltage for a semiconducting glass according to the present invention;

FIG. 6 is a graph of the resistivity against the temperature in air at 20 volts for a semiconducting glass according to the present invention; and FIG. 7 is a graph of the resistivity against $1/T$, where $T$ is the temperature in degrees Kelvin of a semi-conducting glass according to the invention.

DETAILED DESCRIPTION OF THE PREFERRED EMBODIMENTS

In general, the ingredients for a typical batch of glass are thoroughly mixed and then heated to melting temperatures in an electric furnace. After the melts are stirred sufficiently to assure good homogeneity, they are cast and annealed. It is a standard practice to cast the glass in a graphite mold having a configuration such that a bar of glass results. Then, samples may be cut from the resulting bar.

Glass compositions which are considered to be within the scope of the present invention include those consisting essentially of about 25 to 35 wt.% of $V_2O_5$, about 35 to 45 wt.% of $MoO_3$, about 10 to 20 wt.% of $P_2O_5$, up to about 15 wt.% of $BaO$, up to about 5 wt.% of $Al_2O_3$, up to about 10 wt.% of $Fe_3O_4$, up to about 2 wt.% of $CaO$ and up to about 4 wt.% of $Co_3O_4$. The total of the $V_2O_5$ plus $MoO_3$ plus $P_2O_5$ is equal to about 70 to 90 wt.% of the total glass composition. Generally, the glass compositions will have:

A. About 70 to 90 wt.% of three essential ingredients consisting of about 27 to 50 wt.% of $V_2O_5$, about 38 to 65 wt.% of $MoO_3$, and about 11 to 29 wt.% of $P_2O_5$; preferably about 79 to 89%, and 27.8 to 50%, 38.9 to 64.3% and 11.3 to 28.6% respectively;

B. About 2 to 10 wt.% of at least one oxide selected from the group consisting of $Fe_3O_4$ and $Co_3O_4$; and C. About 3 to 20 wt.% of at least one oxide selected from the group consisting of $BaO$, $Al_2O_3$, and $CaO$.

EXAMPLE 1

A glass batch consisting of 145 grams of vanadium pentoxide ($V_2O_5$), 185 grams of molybdenum trioxide ($MoO_3$), 129.6 grams of ammonium dihydrogen phosphate ($(NH_4)H_2PO_4$), 8.95 grams of calcium carbonate ($CaCO_3$), 30 grams of iron oxide ($Fe_3O_4$), 15 grams of cobalt oxide ($CO_3O_4$) and 68 grams of barium nitrate ($Ba(NO_3)_2$) is thoroughly mixed in a glass container. A platinum crucible, capable of holding about 400 cm³ is preheated in an electric furnace to a temperature of about 2000°F (1100°C). The batch is transferred in portions of approximately 100 grams each into the preheated crucible, while the crucible remains in the furnace. The filling is completed in about an hour. The furnace temperature is maintained at 2000°F for an additional 2 hours. The batch is stirred with a ceramic rod after the melting is completed to homogenize the melt. After the stirring, about a half an hour of conditioning is provided. The very fluid melt is then cast into a preheated graphite mold which was held at approximately 600°F (300°C). Immediately after the casting is completed, the graphite mold containing the cast glass is placed in an annealing furnace, preheated to 750°F (400°C). The annealing temperature is held at 750°F for approximately 1 hour and then reduced to 725°F and held for another hour. The furnace is then reduced to 700°F and held for an additional hour. After these 3 hours, the furnace is turned off and the sample permitted to cool freely in the furnace for approximately 16 hours. The annealed sample is removed from the furnace and is in the shape of a bar approximately 4½ inches long, 1¼ inches wide, and 15/16th inches thick. From the glass bar, samples of approximately 2 mm thickness may be cut to determine the properties of the glass.

Following the procedure of Example 1, the process for a number of glasses is approximately the same with the exception of selecting the proper composition. It should be noted that the foregoing time periods are proper only for melts of approximately 1 pound. Larger melts will require commensurately longer periods of time. These times are readily determinable by those skilled in the art. The composition of such other glasses according to the present invention are given below in Table 1. The glass of the foregoing Example 1 is identified as glass EWD-553.

TABLE 1

| $R_mO_n$ | EWD-553 (wt.%) | EWD-552 (wt.%) | EWD-559 (wt.%) | EWD-560 (wt.%) | EWD-562 (wt.%) |
| --- | --- | --- | --- | --- | --- |
| $V_2O_5$ | 29.00 | 28.00 | 32.00 | 29.00 | 30.85 |
| $MoO_3$ | 37.00 | 37.00 | 41.00 | 37.00 | 39.36 |
| $BaO$ | 8.00 | 12.98 | — | 12.00 | 8.51 |
| $Al_2O_3$ | — | 0.58 | 3.86 | — | — |
| $P_2O_5$ | 16.00 | 14.44 | 16.14 | 15.00 | 17.02 |
| $Fe_3O_4$ | 6.00 | 7.00 | 7.00 | 6.00 | — |
| $CaO$ | 1.00 | — | — | 1.00 | 1.07 |
| $Co_3O_4$ | 3.00 | — | — | — | 3.19 |

Flat samples for electrical conductivity measurements are taken from one end of the bars with the plane of the flat faces perpendicular to the long dimension of the bars. The flat faces of the samples are polished with cerium oxide, the thickness of the experimental samples being from approximately 0.075 cm to 0.20 cm. Circular electrodes of about 0.7 cm to 1.2 cm in diameter are painted on opposite sides of the flat polished faces with a silver conductive paint (GC No. 21-1/Walsco No. 36, manufactured by Ernest F. Fullman, Inc., Schenectady, N.Y.). The edges of the samples are also painted with the silver conductive paint to serve as a guard electrode to eliminate any possible effects due to surface conductivity. The schematic diagrams of electrical circuits which may be used to measure the electrical conductivity of the samples are shown in FIGS. 1 and 2. The circuit of FIG. 1 is used for conducting electrical conductivity measurements at a low electric field strength, i.e., from 5 V/cm through 300 V/cm. The circuit of FIG. 2 is used for conducting high electrical field strength measurements at field strengths of from 300 V/cm through 50,000 V/cm.

For studies of the temperature dependence of the electrical conductivity of the samples, a sample holder, for both the glass specimen and the test circuit, is placed in a vacuum oven and stabilized to equilibrium at the desired temperature. The conductivity of the sample at that temperature is then measured. Measurements of conductivity are made at a number of temperatures over the range of 24° to 104°C.

Measurements of the electrical conductivity of the samples at low pressure are made with the sample disposed where the pressure is about $3.5 \times 10^{-5}$ Torr, such as a bell jar in a vacuum system.

Additional electrical conductivity measurements are made on annular samples having an inner diameter of 0.655 cm, an outer diameter of 2.32 cm and a length of 1.09 cm. The ends of these samples are also polished with cerium oxide and coated with inconel and gold. The electrical conductivity measurements are made at the low electrical field strengths with the gold coated surfaces held between aluminum plates in the electrical circuit as shown in FIG. 1.

Referring now to FIG. 1, there is shown a circuit which is useful for measuring the electrical properties of a sample 10 of a semiconductive glass according to the invention. The positive output terminal of a low voltage DC power supply is connected through a suitable conducting means 11, such as a leadwire, to an electrode 13 which is formed of one of the polished sides of the sample 10 with the aforementioned silver conductive paint. The negative output of the power supply 12 is connected via a leadwire 14 to a micro-ammeter 15 which is, in turn, connected to a second electrode of the conductive paint (not shown) on the second polished surface of the glass sample 10 approximately opposite the electrode 13. A voltmeter 17 is connected between the positive terminal of the power supply 12 and a guard electrode 20 formed completely around the unpolished sides of the sample 10 with the silver conductive paint to remove any possible effects due to surface conductivity on the sample 10. Similarly, the guard electrode 20 is also connected to the negative terminal on the power supply 12.

For measuring the electrical properties of the glass under high electrical fields, the circuit shown in FIG. 2 is useful. A sample of glass 30 has a pair of electrodes 31 formed of the silver conductive paint, one of the electrodes being located on each of the two polished faces of the sample 30 approximately opposite each other. One of the electrodes 31 is connected to the positive output terminal of a high voltage DC power supply 34 through a resistor 33. Connected in parallel with the resistor 33 is a first voltmeter 40. A second voltmeter 41 is connected across the positive and negative output terminals of the power supply 34. A micro-ammeter 39 is connected between the negative output terminal of the power supply 34 and the second electrode (not shown). If desired, an X-Y recorder 38 may be used to replace the micro-ammeter 39 or may be connected in parallel therewith. Once again, a guard electrode 44 is formed of the conductive paint on the unpolished sides of the sample 30 prevents any possible effects of surface conduction. The guard electrode is connected directly to the negative terminal at the power supply 34.

The results of the electrical conductivity measurements at low electrical field strengths for the various samples of glass composition of Table 1 are shown in the graph of FIG. 3. (It is to be noted that the postscript letter designation indicates a separate glass melt made of the same composition.) The resistances which are calculated for each of the data points shown in FIG. 3 are given in the Table 2 below. The values of the resistances are given in megohms.

TABLE 2

| Composition | Sample Thickness (cm) | Voltage | | | | | |
|---|---|---|---|---|---|---|---|
| | | 5V | 10V | 15V | 20V | 25V | 28V |
| EWD-552C | 0.2 | 13.2 | 11.6 | 11.5 | 11.0 | 10.8 | 10.7 |
| EWD-553A | 0.085 | 20.8 | 20.0 | 20.0 | 20.0 | 19.2 | 19.2 |
| EWD-553B | 0.2 | 50.0 | 52.6 | 52.0 | 51.3 | 50.0 | 49.3 |
| EWD-560A | 0.2 | 48.0 | 45.0 | 44.0 | 41.0 | 40.0 | — |
| EWD-562A | 0.1 | 38.4 | 37.0 | 41.7 | 37.8 | 36.3 | 36.0 |

As seen from Table 2 and FIG. 3, the resistance property of the samples measured is non-ohmic in nature. For the sample EWD-553, a relatively strong non-linearity in the resistance is observed with increasing voltage up to a threshold voltage. With increasing voltage, the current is observed to increase by an amount greater than that which is predicted by Ohm's Law. Beyond a specific voltage, the current is observed to rise rapidly to an initial value and, thereafter, is observed to creep slowly up to a final equilibrium value. Simultaneously, the voltage across the fixed resistor is observed to increase at a rate commensurate with the rate of current increase through the circuit. The increasing creep in the current occurs over a period of 25 minutes, as shown in FIG. 4, which is a X-Y recorder plot of the current versus time in seconds measured for sample EWD-553A for a total voltage output from the power supply of 4.1 kV. The creep is nery nearly exponential from 122 microamperes to the final equilibrium value of 168 microamperes with a time constant of about 20.5 seconds. The points on the curve are the result of the calculated values of the current using the expression $$I = I_f (1 - e^{-t\gamma})$$

Where I is the intermediate current at time $t$, $I_f$ is the final equilibrium current and $\gamma$ is the time constant. For these calculations, $\gamma$ is taken to be 20.5 seconds.

The voltage current plot of sample EWD-553A, obtained at high electrical field strengths, is shown in FIG. 5. The data points correspond to the final equilibrium values observed. A strong non-linearity begins to occur at field strengths exceeding about 12,000 V/cm. The maximum electrical field strength which the glass can hold off or sustain is about 13,000 V/cm. The data points labelled $x_1$ and $x_f$ in FIG. 5 correspond to the initial and final values, respectively, of the current and electric field strength for the data shown in FIG. 4. The resistivities of the samples are calculated from the slopes of the straight lines in the current versus voltage plot shown in FIG. 3, in ambient air, at room temperature, and are listed below in Table 3.

TABLE 3

| Composition | Resistivity (ohm.cm) | Thickness (cm) |
|---|---|---|
| 552C | $6.0 \times 10^7$ | 0.2 |
| 553A | $2.5 \times 10^8$ | 0.085 |
| 553B | $2.8 \times 10^8$ | 0.2 |
| 560A | $2.2 \times 10^8$ | 0.2 |
| 562A | $5.1 \times 10^8$ | 0.1 |

The resistivity of glass sample EWD-553A, as measured at a pressure of $3.5 \times 10^{-5}$ Torr is found to be $2.2 \times 10^8$ ohm.cm at 5V DC. This agrees reasonably well with the value $2.5 \times 10^8$ ohm.cm measured for the same sample in ambient air. The small difference observed may be due to measurement errors or differences in temperature of the sample at the time of measurement.

The results of the study of temperature dependence of the resistivity on sample EWD-553A are summarized in FIGS. 6 and 7. FIG. 6 is a plot of the resistivity in megohm.cm versus temperature in air (in degrees C) at 20 V DC. THe resistivity of the sample measured is sensitively dependent on temperature with a negative temperature coefficient of resistance. The temperature coefficient of resistance $\alpha$ may be expressed as, $$\alpha = \frac{1}{R_1} \frac{(R_1 - R_2)}{(T_1 - T_2)}$$

where $R_1$ and $R_2$ are the resistances at the temperatures $T_1$ and $T_2$ respectively. For sample EWD-553A, $\alpha$ is about $-2.8\%/°C$ at 25°C.

In FIG. 7, the curve is a plot of log resistivity versus $1/T$, where T is the temperature in degrees Kelvin. Over the temperature range investigated, it is found that the resistivity may be described by the Arrhenius equation, $$P = P_o e^{E^*/kT}$$

Where P is a resistivity, $P_o$ is a constant, $E^*$ is a socalled activation energy for conduction, $k$ is the Boltzmann factor. For sample EWD-553A, E is found to be about 0.5eV.

The resistivities of all the glasses tested are found to be within the range required for the particular application. For the samples of formula EWD-552, it is found that the electrical puncture voltage for a 1 mm thick sample was 1.6 kV for several minutes at the voltage. whereas, a 0.085 centimeter thick specimen of EWD-553 holds off the same voltage for several minutes. Therefore, EWD-553 is preferred for the application of a leakage resistor for an electron microscope. For this sample, a negative temperature coefficient of resistance $\alpha$ of about $-2.8\%/°C$ at 25°C is found. In addition, it is found that the resistivity of the samples of formula EWD-553 are described by the Arrhenius equation over the temperature range of from 22° to 104°C. The activation energy for conduction, $E^*$, is found to be about 0.5eV. The conduction mechanism may be considered to be ionic if $0.7 \text{ eV} < E < 2.4 \text{ eV}$ and electronic if $E^* < 0.7$ eV. It seems apparent that the primary conduction mechanism in the semiconducting glasses is electronic.

While there has been shown and described what are considered to be preferred embodiments of the present invention, it will be obvious to those skilled in the art that various changes and modifications may be made therein without departing from the invention as defined in the appended claims.

What is claimed is:

1. A semiconducting glass composition consisting essentially of as given in weight percent:

| | |
|---|---|
| $V_2O_5$ | 25–35 |
| $MoO_3$ | 35–45 |
| $P_2O_5$ | 10–20 |
| BaO | 0–15 |
| $Al_2O_3$ | 0–5 |
| $Fe_3O_4$ | 0–10 |
| CaO | 0–2 |
| $Co_3O_4$ | 0–4 | with $V_2O_5 + MoO_3 + P_2O_5$ being in the range of 70 to 90 weight percent, the glass being chemically stable and having a resistivity within the range of from about $2 \times 10^7$ to about $6 \times 10^8$ ohm·cm.

2. A semiconducting glass composition according to claim 1 wherein the ingredients are present in the following weight percentages:

| | |
|---|---|
| $V_2O_5$ | 28.00 |
| $MoO_3$ | 37.00 |
| BaO | 12.98 |
| $Al_2O_3$ | 0.58 |
| $P_2O_5$ | 14.44 |
| $Fe_3O_4$ | 7.00 |

3. A semiconducting glass composition according to claim 1 wherein the ingredients are present in the following weight percentages:

| | |
|---|---|
| $V_2O_5$ | 29.00 |
| MoO | 37.00 |
| BaO | 8.00 |
| $P_2O_5$ | 16.00 |
| $Fe_3O_4$ | 6.00 |
| CaO | 1.00 |
| $Co_3O_4$ | 3.00 |

4. A semiconducting glass composition according to claim 1 wherein the ingredients are present in the following weight percentages:

| | |
|---|---|
| $V_2O_5$ | 32.00 |
| $MoO_3$ | 41.00 |
| $Al_2O_3$ | 3.86 |
| $P_2O_5$ | 16.14 |
| $Fe_3O_4$ | 7.00 |

5. A semiconducting glass composition according to claim 1 wherein the ingredients are present in the following weight percentages:

| | |
|---|---|
| $V_2O_5$ | 29.00 |
| $MoO_3$ | 37.00 |
| BaO | 12.00 |
| $P_2O_5$ | 15.00 |
| $Fe_3O_4$ | 6.00 |
| CaO | 1.00 |

6. A semiconducting glass composition according to claim 1 wherein the ingredients are present in the following weight percentages:

| | |
|---|---|
| $V_2O_5$ | 30.85 |
| $MoO_3$ | 39.36 |
| BaO | 8.51 |
| $P_2O_5$ | 17.02 |
| CaO | 1.07 |
| $Co_3O_4$ | 3.19 |

7. A semiconducting glass composition according to claim 1 wherein the $V_2O_5 + MoO_3 + P_2O_5$ is about 79–89%.

8. A method of manufacturing a semiconducting glass composition comprising:
thoroughly mixing the following ingredients where the ingredients are present in the following ranges as given in weight percent:

| | |
|---|---|
| $V_2O_5$ | 25–35 |
| $MoO_3$ | 35–45 |
| $P_2O_5$ | 10–20 |
| BaO | 0–15 |
| $Al_2O_3$ | 0–5 |
| $Fe_3O_4$ | 0–10 |
| CaO | 0–2 |
| $Co_3O_4$ | 0–4 | where the $V_2O_5 + MoO_3 + P_2O_5$ is in the range of 70 to 90 weight percent;
gradually filling the thoroughly mixed ingredients into a crucible preheated to at least 2000°F;
heating the filled crucible to above the melting temperature of the ingredients;
maintaining the temperature until all of the ingredients are melted;
stirring the resulting melt to assure homogeniety;
casting the melt in a mold preheated to a temperature above the strain point of the glass; and
annealing the case glass.

9. A glass composition consisting essentially of:
about 70 to 90 weight percent of the essential ingredients $V_2O_5$, $MoO_3$, and $P_2O_5$;
the $V_2O_5$ being present in an amount ranging from 27.8 to 50 weight percent of the essential ingredients;
the $MoO_3$ being present in an amount ranging from 38.9 to 64.3 weight percent of the essential ingredients; and
the $P_2O_5$ being present in an amount ranging from 11.3 to 28.6 weight percent of the essential ingredients;
about 2 to 10 weight percent of at least one modifying oxide selected from the group consisting of $Fe_3O_4$ and $Co_3O_4$; and
about 3 to 20 weight percent of at least one modifying oxide selected from the group consisting of BaO, $Al_2O_3$, and CaO.

10. The invention of claim 9 wherein said modifying oxides are BaO, $Al_2O_3$ and $Fe_3O_4$.

11. The invention of claim 9 wherein said modifying oxides are BaO, $Fe_3O_4$, CaO and $Co_3O_4$.

12. The invention of claim 9 wherein said modifying oxides are $Al_2O_3$, and $Fe_3O_4$.

13. The invention of claim 9 wherein said modifying oxides are BaO, $Fe_3O_4$, and CaO.

14. The invention of claim 9 wherein said modifying oxides are BaO, CaO, and $Co_3O_4$.

* * * * *